(12) United States Patent
Feurprier et al.

(10) Patent No.: US 8,202,803 B2
(45) Date of Patent: Jun. 19, 2012

(54) METHOD TO REMOVE CAPPING LAYER OF INSULATION DIELECTRIC IN INTERCONNECT STRUCTURES

(75) Inventors: Yannick Feurprier, Watervliet, NY (US); Douglas M. Trickett, Altamont, NY (US)

(73) Assignee: Tokyo Electron Limited, Tokyo (JP)

( * ) Notice: Subject to any disclaimer, the term of this patent is extended or adjusted under 35 U.S.C. 154(b) by 265 days.

(21) Appl. No.: 12/636,430

(22) Filed: Dec. 11, 2009

(65) Prior Publication Data
US 2011/0143542 A1 Jun. 16, 2011

(51) Int. Cl.
*H01L 21/311* (2006.01)
(52) U.S. Cl. .................. 438/700; 257/E21.214; 257/774
(58) Field of Classification Search .................. 438/700, 438/618; 257/774, E21.214, E21.575–E21.597, 257/E21.627, E21.641
See application file for complete search history.

(56) References Cited

U.S. PATENT DOCUMENTS

| | | | |
|---|---|---|---|
| 7,833,893 B2 * | 11/2010 | Grunow et al. | 438/597 |
| 2003/0157806 A1 | 8/2003 | Nagahara et al. | |
| 2004/0121616 A1 | 6/2004 | Satta et al. | |
| 2007/0141852 A1 | 6/2007 | Stapelmann et al. | |
| 2007/0238298 A1 * | 10/2007 | Brown | 438/694 |
| 2008/0142988 A1 | 6/2008 | Hyland et al. | |

OTHER PUBLICATIONS

International Searching Authority, International Search Report and Written Opinion, International Application No. PCT/US2010/059114, Mailed Feb. 4, 2011, 10 pages.

* cited by examiner

*Primary Examiner* — Tony Tran

(57) ABSTRACT

A method for patterning an insulation layer and selectively removing a capping layer overlying the insulation layer is described. The method utilizes a dry non-plasma removal process. The dry non-plasma removal process may include a self-limiting process.

16 Claims, 19 Drawing Sheets

METHOD TO REMOVE CAPPING LAYER OF INSULATION DIELECTRIC IN INTERCONNECT STRUCTURES

BACKGROUND OF THE INVENTION

1. Field of Invention

The invention relates to a method for selectively removing a material layer from a substrate and, more particularly, a method for selectively removing a capping layer overlying an insulation dielectric.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials during production of the IC. Such low-k materials have also proven useful for low temperature processing. Thus, in recent years, low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

While low-k materials are promising for fabrication of semiconductor circuits, the present inventors have recognized that these films also provide many challenges. First, low-k films tend to be less robust than more traditional dielectric layers and can be damaged during wafer processing, such as by etch and plasma ashing processes generally used in patterning the dielectric layer. Further, some low-k films tend to be highly reactive when damaged, particularly after patterning, thereby allowing the low-k material to absorb water and/or react with other vapors and/or process contaminants that can alter the electrical properties of the dielectric layer.

When the damaged surface layer of the low-k film is removed, an undercut may form beneath the hard mask layer or dielectric capping layer of the low-k film stack. Consequently, this undercut creates challenges during metallization of the pattern formed in the low-k film, i.e., barrier layer formation and metal fill.

SUMMARY OF THE INVENTION

The invention relates to a method for selectively removing a material layer from a substrate and, more particularly, a method for selectively removing a capping layer overlying an insulation dielectric.

The invention further relates to a method for patterning an insulation layer and selectively removing a capping layer overlying the insulation layer, wherein the method utilizes a dry non-plasma removal process. The dry non-plasma removal process may include a self-limiting process.

According to one embodiment, a method of preparing a low dielectric constant (low-k) layer on a substrate is described. The method comprises disposing a substrate having an insulation layer and a capping layer overlying the insulation layer in a treatment system, wherein a pattern has been transferred to the capping layer and the insulation layer in order to form a feature through the capping layer and within the insulation layer, and wherein a surface layer of the insulation layer has been exposed to an etching plasma during the pattern transfer. The method further comprises performing a dry non-plasma removal process on the capping layer to remove the capping layer.

DETAILED DESCRIPTION OF SEVERAL EMBODIMENTS

Figure 1A:
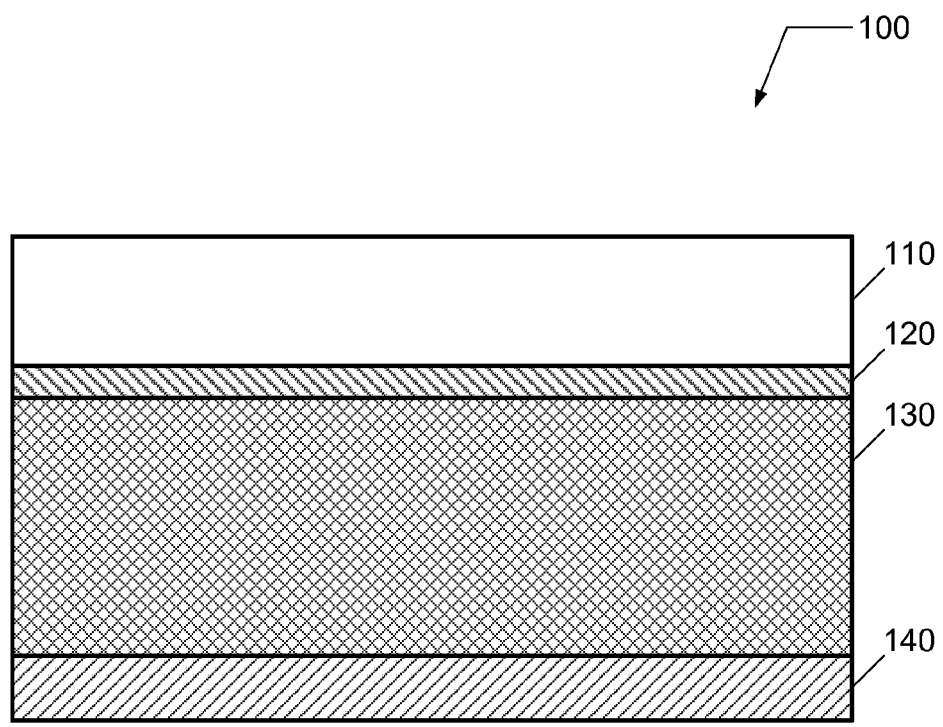
FIGS. 1A through 1H depict an exemplary sequence for preparing an insulation layer on a substrate according to an embodiment.

In the following description, in order to facilitate a thorough understanding of the invention and for purposes of explanation and not limitation, specific details are set forth, such as a particular geometry of the treatment system and descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure of the light-sensitive material to a geometric pattern of electro-magnetic (EM) radiation using, for example, a micro-lithography system, followed by the removal of the irradiated regions of the light-sensitive material (as in the case of positive photo-resist), or non-irradiated regions (as in the case of negative resist) using a developing solution.

Additionally, multi-layer masks and hard masks can be implemented for etching features in a thin film. For example, when etching features in a thin film using a hard mask, the mask pattern in the light-sensitive layer is transferred to the hard mask layer using a separate etch step preceding the main etch step for the thin film. The hard mask can, for example, be selected from several materials for silicon processing including silicon-containing materials or carbon-containing materials or a combination thereof, such as silicon dioxide ($SiO_2$), silicon nitride ($Si_3N_4$), and carbon. Further yet, the features formed within the thin film may also include additional layers such as, but not limited to, etch stop layers, chemical-mechanical planarization (CMP) stop layers, capping layers, etc.

Referring now to the drawings, wherein like reference numerals designate identical or corresponding parts throughout the several views, FIGS. 1A through 1H illustrate a method of preparing a film stack 100 having an insulation layer on a substrate according to an embodiment. The method combines various aspects of the invention including using a capping layer as a hard mask layer or part of one or more hard mask layers to pattern the insulation layer. The capping layer is removed before, during, or after the removal of damaged surfaces/layers on the insulation layer as a consequence of the pattern etching or ashing processes. However, aspects of the process in FIGS. 1A-1H may be used separately from one another as discussed below. Additionally, FIG. 2 presents a flow chart 200 of performing the method according to one embodiment.

Figure 1B:
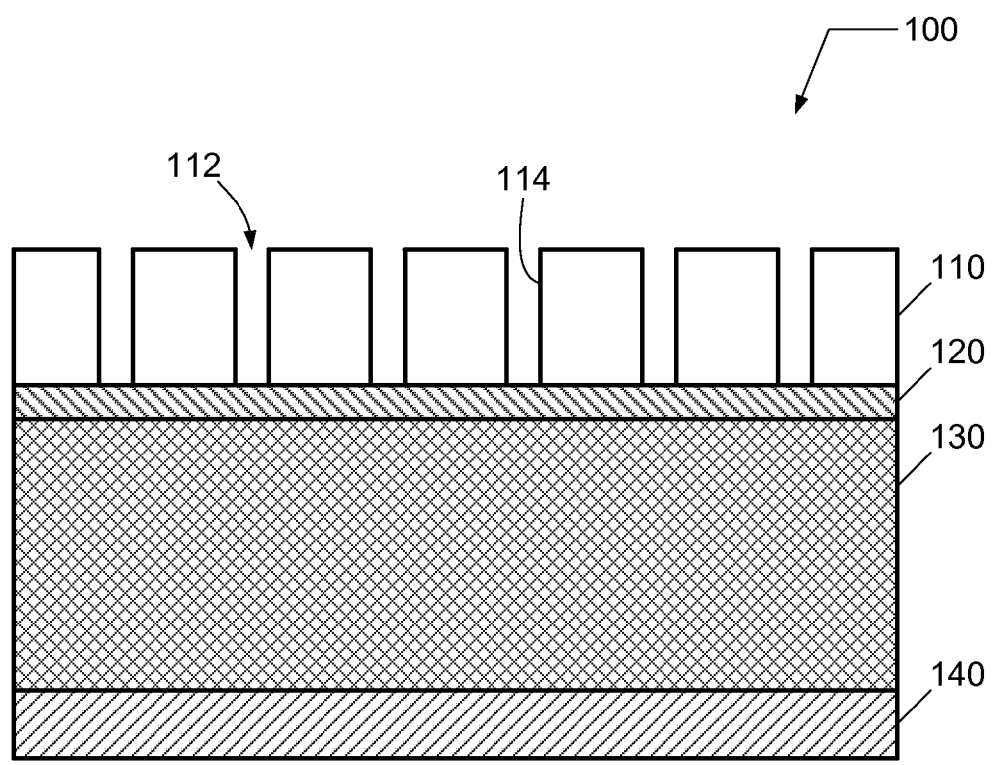
Figure 2:
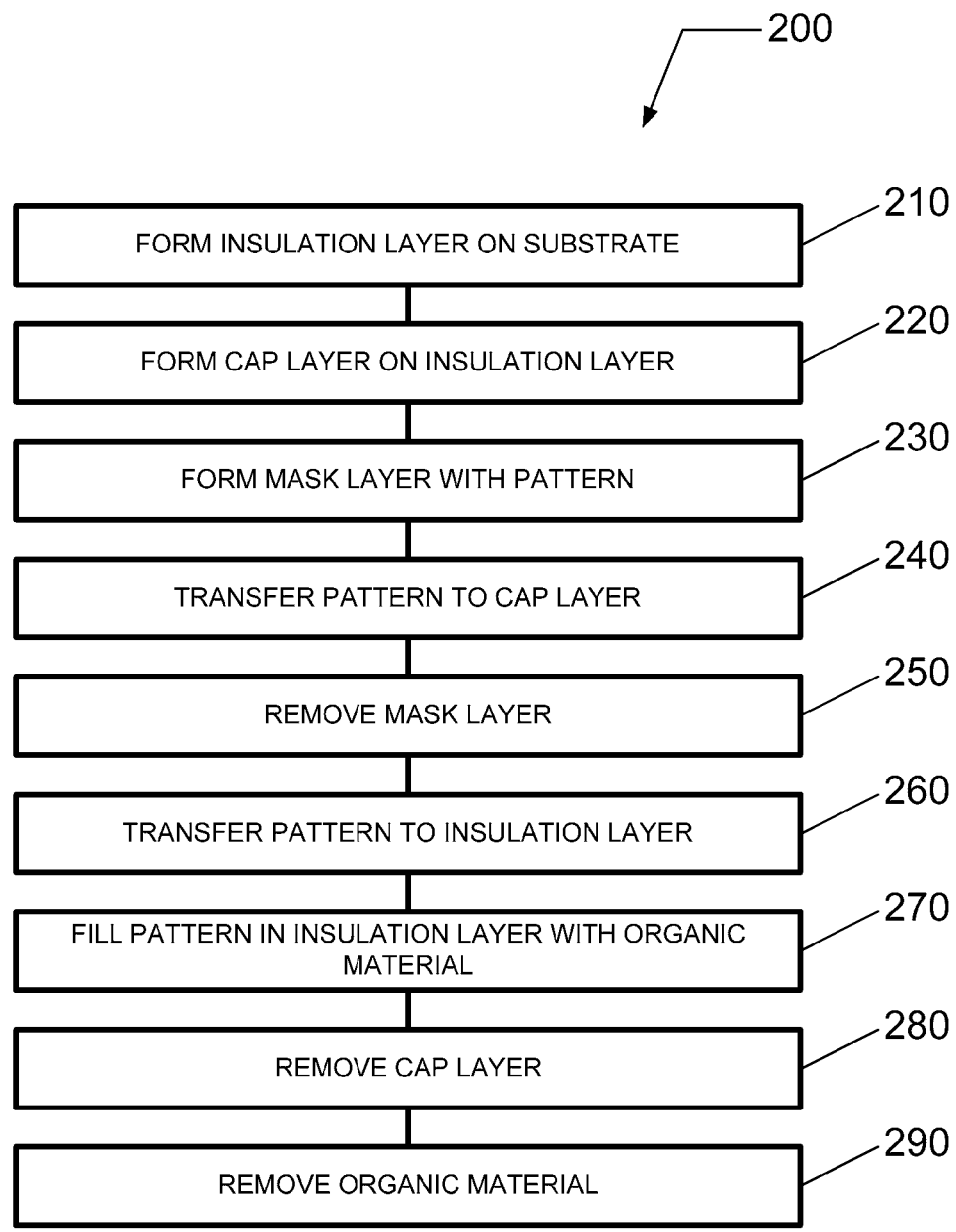
FIG. 2 illustrates a method of preparing an insulation layer on a substrate according to an embodiment.

As shown in FIGS. 1A, 1B, and 2, an insulation layer 130 is formed in step 210 on an upper surface of a substrate 140 that may or may not include additional layers. The substrate 140 may be a semiconductor, a metallic conductor, or any other substrate to which the insulation layer is to be formed upon. The insulation layer may include a dielectric layer, such as a low dielectric constant (low-k) dielectric layer, that has a nominal dielectric constant value less than the dielectric constant of $SiO_2$, which is approximately 4 (e.g., the dielectric constant for thermal silicon dioxide can range from 3.8 to 3.9). More specifically, the insulation layer 130 may have a dielectric constant of less than 3.0, or a dielectric constant ranging from 1.6 to 2.7.

The insulation layer 130 may include at least one of an organic, inorganic, or inorganic-organic hybrid material. Additionally, the insulation layer 130 may be porous or non-porous. Additionally, the insulation layer 130 may include a cured low-k dielectric layer or an uncured dielectric material.

For example, these dielectric layers may include an inorganic, silicate-based material, such as carbon doped silicon oxide (or organo siloxane), deposited using CVD techniques. Examples of such films include BLACK DIAMOND CVD organosilicate glass (OSG) films (insulating material for semiconductor processing) commercially available from Applied Materials, Inc., or CORAL CVD films (insulating material for semiconductor processing) commercially available from Novellus Systems, Inc.

Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ (insulating material for semiconductor processing) commercially available from Dow Corning Corporation, XLK porous HSQ (insulating material for semiconductor processing) commercially available from Dow Corning Corporation, and JSR LKD-5109 (insulating material for semiconductor processing) commercially available from JSR Microelectronics.

Still alternatively, these dielectric layers may include an organic material deposited using SOD techniques. Examples of such layers include SILK-I, SILK-J, SILK-H, SILK-D, porous SILK-T, porous SILK-Y, and porous SILK-Z semiconductor dielectric resins (insulating materials for semiconductor processing) commercially available from Dow Chemical Company, and FLARE, and NANOGLASS (insulating materials for semiconductor processing) commercially available from Honeywell International, Inc.

The insulation layer 130 can be formed using a vapor deposition technique, such as chemical vapor deposition (CVD), plasma enhanced CVD (PECVD), atomic layer deposition (ALD), plasma enhanced ALD (PEALD), initiated CVD (i-CVD), filament-assisted CVD (FACVD), physical vapor deposition (PVD), or ionized PVD (iPVD), or a spin-on technique, such as those offered in the CLEAN TRACK ACT 8 SOD (spin-on dielectric) (a spin coating machine for semiconductor processing), ACT 12 SOD (a spin coating machine for semiconductor processing), and LITHIUS coating systems commercially available from Tokyo Electron Limited (TEL) (Tokyo, Japan). The CLEAN TRACK ACT 8 (200 mm), ACT 12 (300 mm), and LITHIUS (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

In the embodiment of FIGS. 1A-1H, once the insulation layer 130 is prepared, a cap layer 120 is formed in step 220 on an upper surface thereof. The cap layer 120 can include silicon oxide ($Si_xO_y$), silicon nitride ($Si_xN_y$), silicon oxynitride ($Si_xO_yN_z$), silicon oxycarbide ($Si_xO_yC_z$), and carbon, together, or any combination thereof for example. For instance, the cap layer 120 may serve as a capping layer for the underlying insulation layer 130.

Thereafter, a mask layer 110 is formed in step 230 on an upper surface of the cap layer 120. The mask layer 110 can include a photo-lithographic pattern 112 formed in a layer of light-sensitive material, such as photo-resist, using photo-lithography. Alternatively, the mask layer 110 can include a bilayer mask, or multilayer mask, having an anti-reflective coating (ARC), such as a buried ARC (BARC) layer or a tunable etch resistant ARC (TERA) layer, embedded therein. The ARC layer may be an organic ARC or an inorganic ARC. Alternatively yet, the mask layer 110 can include a multilayer mask having a thin layer of photo-resist overlying an ARC layer overlying an organic planarization layer (OPL). The thickness of the photo-resist can be relatively thin and the thickness of the ARC layer can be tuned to the exposure wavelength, while the thickness of the OPL can be arbitrary depending upon the requirements of the etch process.

For example, the cap layer 120 and mask layer 110, can be formed using a track system, or chemical vapor deposition (CVD) system. The track system can be configured for processing 248 nm resists, 193 nm resists, 157 nm resists, EUV resists, (top/bottom) anti-reflective coatings (TARC/BARC), and top coats. For example, the track system can include a CLEAN TRACK ACT 8, or ACT 12 resist coating and developing system commercially available from Tokyo Electron Limited (TEL). Other systems and methods for forming a photo-resist film on a substrate are well known to those skilled in the art of spin-on resist technology. Additionally, for example, the mask pattern can be formed using any suitable conventional stepping lithographic system, or scanning lithographic system.

Advanced photo-lithography for smaller geometries (i.e., 45 nm, 32 nm, and beyond) is generally constrained by the requirements to: optimize the accurate communication of photo-lithographic pattern 112 to the mask layer 110, minimize the thickness of the mask layer 110 to prevent pattern collapse, optimize the composition and thickness of the mask layer 110 for accurate communication of the pattern 112 from the mask layer 110 to the underlying layer, and minimize the transfer of line-edge-roughness (LER) in sidewall 114 of the photo-lithographic pattern 112 to the underlying film.

Conventionally, the mask pattern in a light sensitive layer is transferred to the underlying layer(s) using a plasma etch process. Due to the anisotropic nature of the plasma etch, the pattern in the light sensitive layer can be transferred to the underlying layer(s) with high precision. Also in a conventional process using a multi-layer mask, the patterned light sensitive layer is first used to etch the underlying mask sublayers, and the multi-layer mask is subsequently used together to etch the pattern into the dielectric layer. Then, the light sensitive layer and/or residue thereof are removed using a stripping, ashing or wet cleaning process, for example. The present inventors have recognized that exposing the etched dielectric feature to a light sensitive layer removal process can damage the dielectric feature and/or change characteristics of the dielectric material within the dielectric feature. Such damage is in addition to damage of the dielectric feature that can be caused by etching of the feature itself.

Figure 1C:
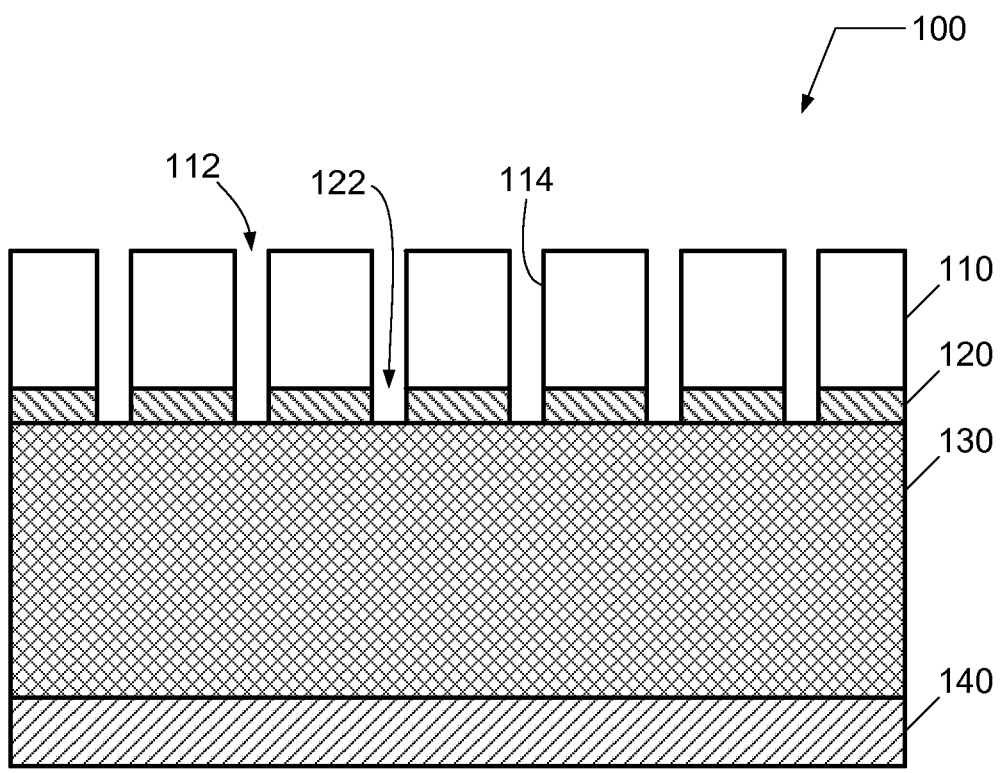
Figure 1D:
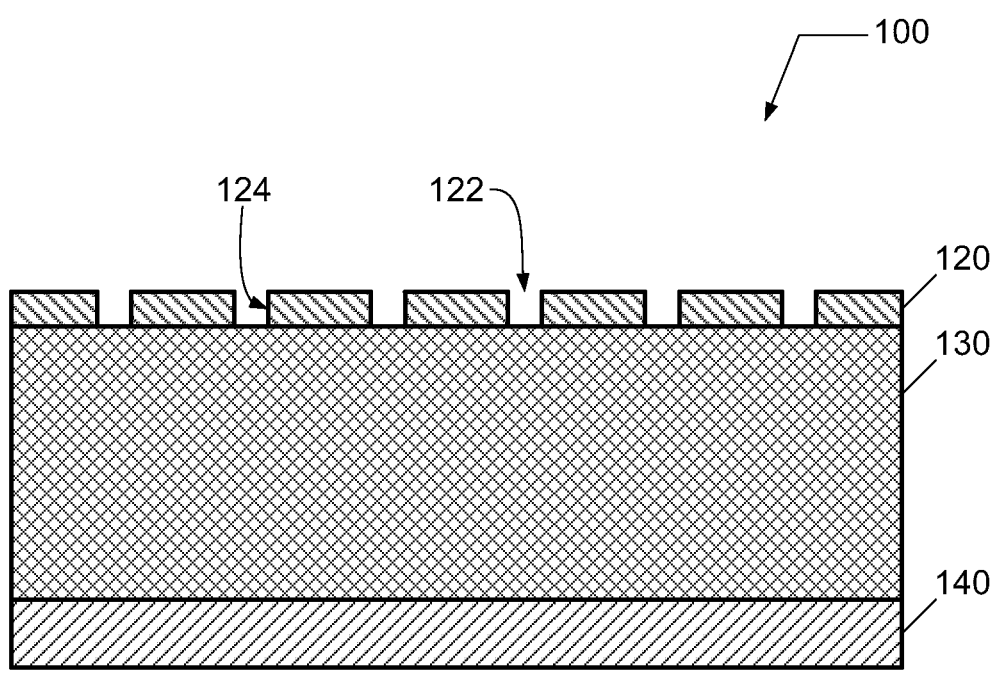

As shown in FIGS. 1C and 1D, the photo-lithographic pattern 112 can be transferred in step 240 to the cap layer 120 using a dry etching process, such as a dry non-plasma etching process or dry plasma etching process. Additional details for using a dry non-plasma etching process are provided in pending U.S. patent application Ser. No. 11/390,193, entitled "METHOD FOR REMOVING DAMAGED DIELECTRIC MATERIAL" (TEA-024), published as US Patent Application Publication No. 2007/0235411, filed on Mar. 28, 2006, and pending U.S. patent application Ser. No. 11/390,197, entitled "METHOD AND SYSTEM FOR PATTERNING A DIELECTRIC FILM" (TEA-026), issued as U.S. Pat. No. 7,288,483, filed on Mar. 28, 2006; the entire contents of these applications are herein incorporated by reference in their entirety.

As shown in FIG. 1D, once the mask pattern 122 is formed in the cap layer 120, the mask layer 110 can be removed in step 250 using a wet or dry stripping/ashing process prior to etching the insulation layer 130. As one advantage, for instance, the removal of the mask layer 110 prior to etching the insulation layer 130 may be simpler, due to the lack of hardened crusts resulting from the insulation layer etching process. Additionally, for instance, the removal of the mask layer 110 prior to the insulation layer etch minimizes the exposure of insulation layer 130 to a wet clean process when applying strip chemicals during a wet stripping process, or an ashing process when using an oxidizing plasma to remove photoresist and post-etch residue. Advanced (porous or nonporous) dielectric materials can be damaged when exposed to these etching, stripping and/or ashing processes, and thus, prior removal of the light sensitive layer can minimize damage of the dielectric layer. Alternatively, the mask layer 110 may not be removed in step 250. For example, the mask layer 110 may be removed following the transfer of the pattern to insulation layer 130. Additionally, for example, when the mask layer 110 comprises a layer of photo-resist, an ARC layer and an OPL, the photo-resist and the ARC layer may be consumed during the etching of the cap layer 120 and the insulation layer 130. Once the pattern is transferred to the cap layer 120 and the insulation layer 130, the remaining OPL may be removed.

Figure 1E:
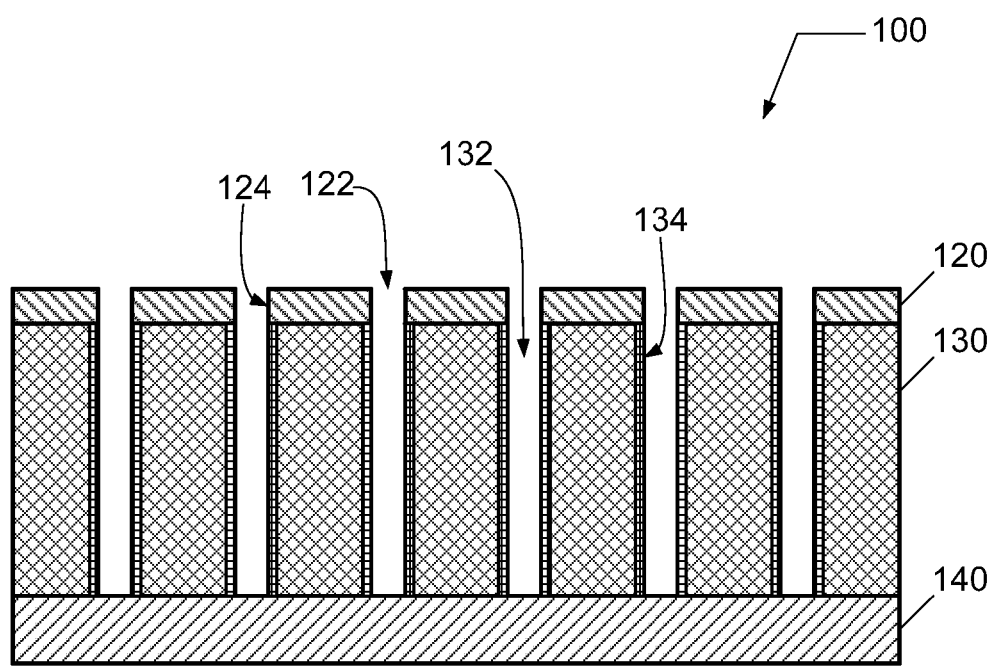

In step 260, as shown in FIG. 1E, mask pattern 122 is transferred to insulation layer 130 using dry plasma etching to form feature 132. Following this pattern transfer, a sidewall 124 of cap layer 120 may be approximately aligned with a sidewall 134 of insulation layer 130. For instance, when etching oxide dielectric films such as silicon oxide, silicon dioxide, etc., or when etching organic low-k dielectric films such as oxidized organosilanes, the etch gas composition generally includes a fluorocarbon-based chemistry such as at least one of $C_4F_8$, $C_5F_8$, $C_3F_6$, $C_4F_6$, $CF_4$, etc., or a fluorohydrocarbon-based chemistry such as at least one of $CHF_3$, $CH_2F_2$, etc., and at least one of an inert gas, oxygen, and carbon monoxide (CO). Additionally, for example, when etching organic low-k dielectric films, the etch gas composition generally includes at least one of a nitrogen-containing gas, and a hydrogen-containing gas. The techniques for selectively etching a dielectric film, such as those described earlier, are well known to those skilled in the art of dielectric etch processes.

During etching or during the removal of any remaining residue or both, exposed surfaces within the feature 132 formed in the insulation layer 130, such as sidewalls 134, can be damaged, or activated. The damage or activation incurred by these surfaces can lead to the absorption of water, or the adhesion of contaminants and/or chemicals during etch processing (i.e., dry etching of the dielectric layer, or photolithographic mask removal during ashing following the dielectric layer etch). For example, porous low-k dielectric films can be very susceptible to damage and/or activation during etch processing. In general, porous low-k films are most commonly silicon-oxide based with silanol (Si—OH) groups and/or organo groups. These materials can become activated or damaged due in part to the depletion of an organic component during etch processing.

Additionally, silanol groups are exposed which can readily absorb water, and/or other contaminants. Accordingly, device structures with exposed low-k dielectric layers are difficult to handle and maintain contaminant free, especially after patterning steps. Moreover, activation and/or damage to the bulk of the low-k material can result in an increase to the dielectric constant (k-value). It has been observed that the activated or damaged low-k film can exhibit an increase of the k-value by a value of one or more.

Figure 3:
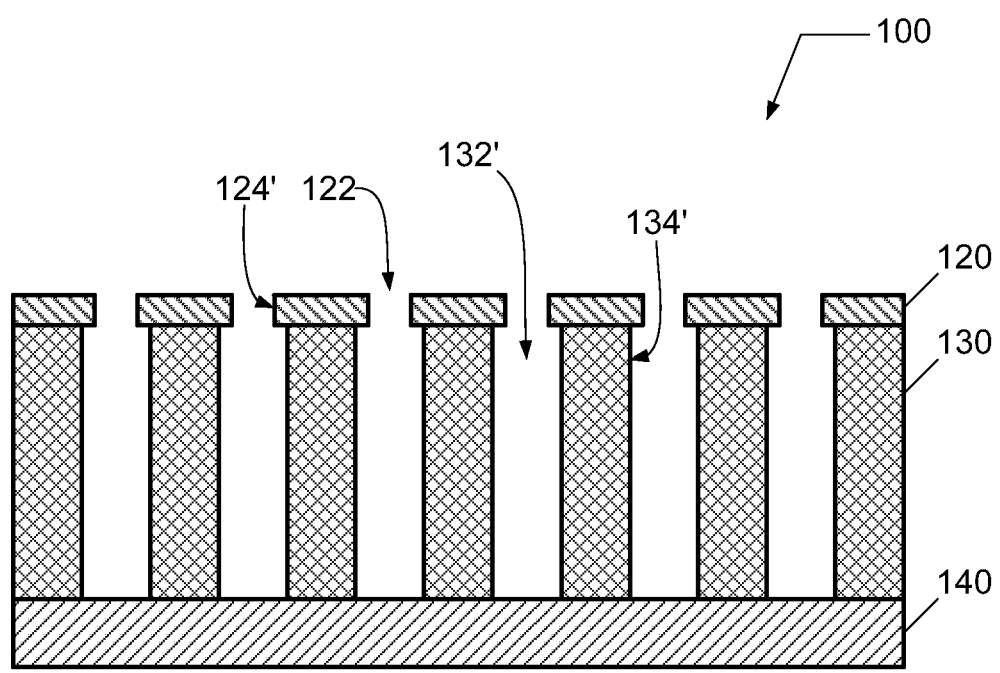
FIG. 3 depicts an insulation layer on a substrate exhibiting an overhang.

Consequently, the damaged material is generally removed using a cleaning process. However, as illustrated in FIG. 3, the conventional cleaning process utilized to remove the damaged material undercuts the cap layer 120 leaving a sidewall 124' of cap layer 120 overhanging a recessed sidewall 134' in the insulation layer 130. The undercut in the insulation layer 130 beneath the overhanging hard mask layer 120 provides a feature 132' that presents challenges during subsequent fill steps, or metallization steps.

Figure 1F:
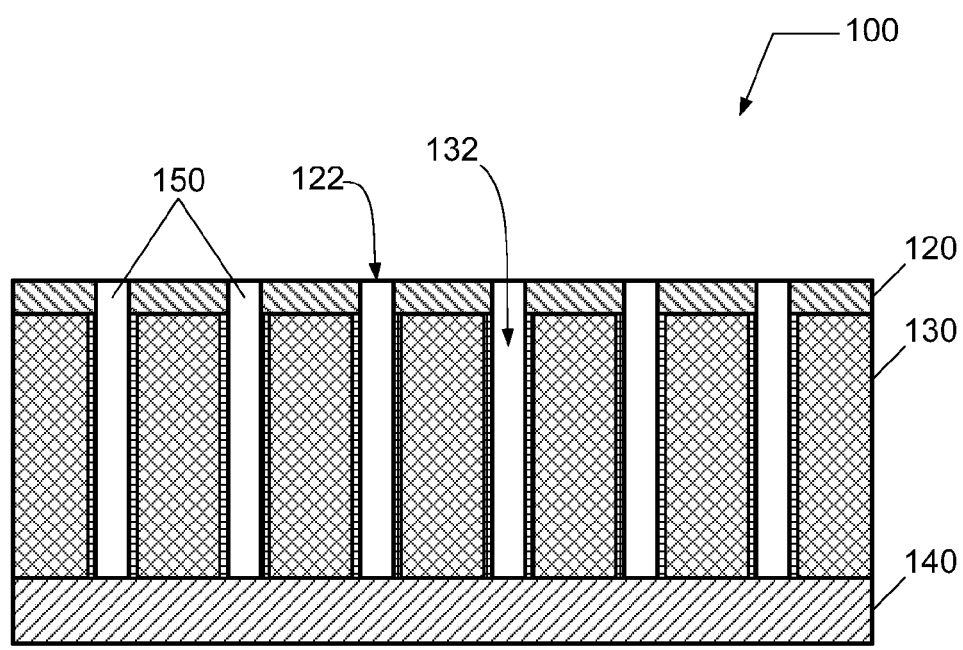
Figure 1G:
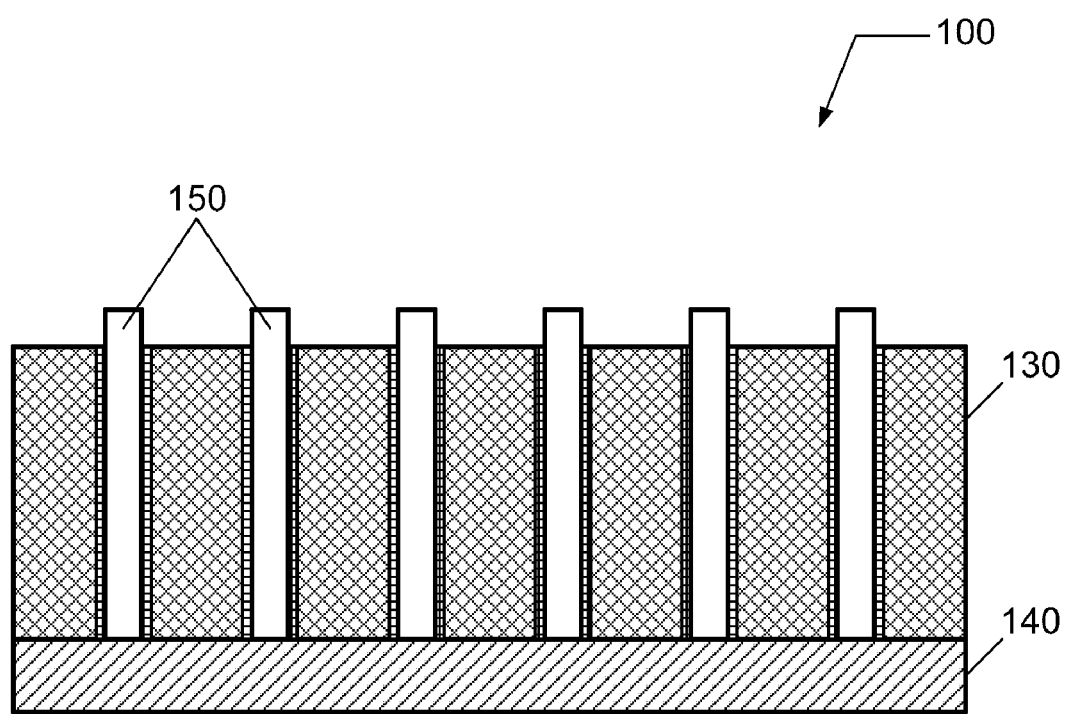
Figure 1H:
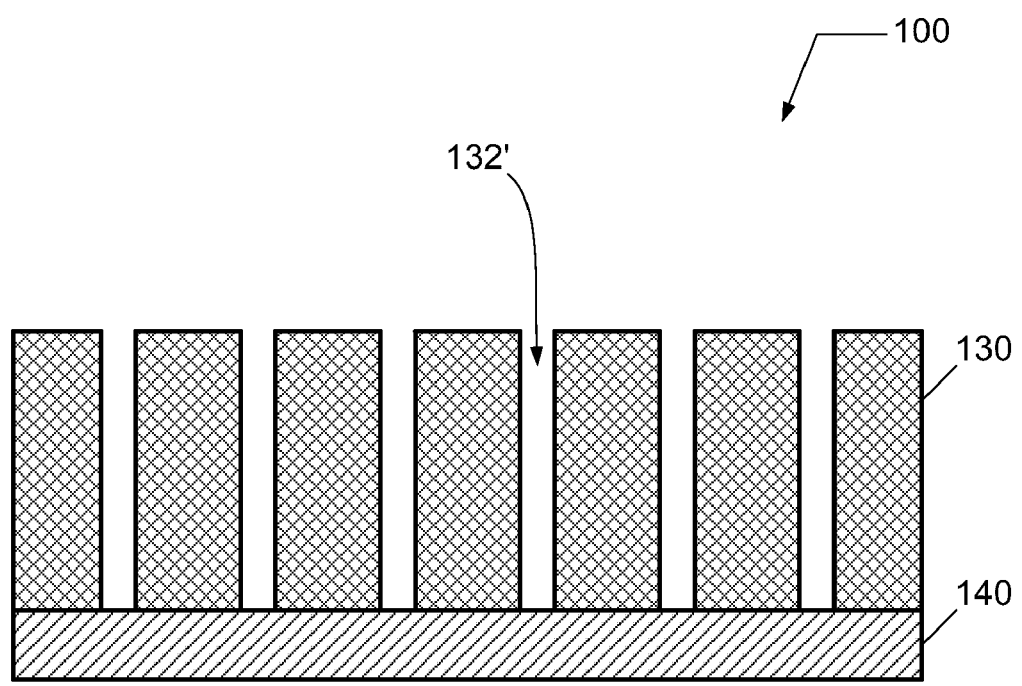

According to an embodiment, the feature 132 is filled with an organic material 150 in step 270, the cap layer 120 is removed in step 280 using a dry, non-plasma etching process, and the organic material 150 in feature 132 is removed, as shown in FIGS. 1F through 1H. Although steps 270 and 280 are shown in FIG. 2 and illustrated in FIGS. 1F through 1H, these steps may be omitted and the cap layer 120 may be removed using the dry, non-plasma etching process (without the feature fill step (i.e., 270) and the fill material removal step (i.e., 280).

The organic material 150 may be formed using a spin coating process. For example, the organic material 150 may be applied to substrate 140 using a track system, such as a CLEAN TRACK ACT 8, or ACT 12 resist/SOD coating and developing system commercially available from Tokyo Electron Limited (TEL). Other systems and methods for applying an organic material to a substrate are well known to those skilled in the art of spin-on technology. The organic material 150 may include an organic polymer. For example, the organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). Additionally, for example, the organic material 150 may include a photo-resist, such as a 248 nm resist, a 193 nm resist, a 157 nm resist, or an EUV resist, a (top/bottom) anti-reflective coating (TARC/BARC), a top coat, or an organic planarization layer (OPL).

The dry non-plasma etching process includes a self-limiting removal process for process control, which permits precise removal of the cap layer 120 with high selectivity to other materials. The dry, non-plasma etching process includes a chemical process during which at least a portion of the cap layer 120, e.g., exposed surfaces of the cap layer 120, as shown in FIG. 1F, are chemically treated by a process gas comprising HF, or ammonia ($NH_3$), or both HF and $NH_3$. Following the chemical treatment process, a desorption process is performed in order to remove the chemically altered portion of cap layer 120. The desorption process can comprise a thermal treatment process within which the temperature of the substrate is raised sufficiently high to permit the volatilization of the chemically altered portion of cap layer 120. For example, the temperature for the thermal treatment process may be greater than the temperature for the chemical treatment process.

Therein, the exposing of the portion of the cap layer 120 to the process gas causes chemical alteration of the cap layer 120 to a self-limiting depth, and the chemically altered portion of the cap layer extending to the self-limiting depth is removed during the thermal treating. The exposing and the thermal treating are repeated until the cap layer 120 is substantially removed, as shown in FIG. 1G. Alternatively, the exposing and the thermal treating are repeated until the cap layer 120 is removed to within a remaining thickness less than 20% of the original thickness. Alternatively, the exposing and the thermal treating are repeated until the cap layer 120 is removed to within a remaining thickness less than 10% of the original thickness. Alternatively yet, the exposing and the thermal treating are repeated until the cap layer 120 is removed to within a remaining thickness less than 5% of the original thickness.

During the chemical treatment process, each constituent of the process gas may be introduced together (i.e., mixed), or separately from one another (i.e., HF introduced independently from $NH_3$). Additionally, the process gas can further include an inert gas, such as a noble gas (i.e., argon). The inert gas may be introduced with either the HF or the $NH_3$, or it may be introduced independently from each of the aforementioned gaseous constituents. Further details regarding the introduction of a noble gas with $NH_3$ in order to control the extent to which surface layers of the dielectric film are chemically altered is described in pending U.S. patent application Ser. No. 10/812,347, entitled "Processing system and method for treating a substrate" and published as U.S. Patent Application Publication No. 2005/0227494, the entire contents of which are herein incorporated by reference in their entirety.

Additionally, during the chemical treatment process, the process pressure may be selected to affect the extent to which surface layers of the dielectric film are chemically altered. The process pressure can range from approximately 1 mtorr to approximately 100 torr. Furthermore, during the chemical treatment process, the substrate temperature may be selected to affect the extent to which surface layers of the dielectric film are chemically altered. The substrate temperature can range from approximately 10 degrees C. to approximately 200 degrees C. Further details regarding the setting of the substrate temperature in order to control the extent to which surface layers of the dielectric film are chemically altered is described in pending U.S. patent application Ser. No. 10/817,417, entitled "Method and system for performing a chemical oxide removal process" and published as U.S. Patent Application Publication No. 2005/0218114, the entire contents of which are herein incorporated by reference in their entirety.

During the thermal treatment process, the substrate temperature can be elevated above approximately 50 degrees C., or desirably above approximately 100 degrees C. Additionally, an inert gas may be introduced during the thermal treatment of the substrate. The inert gas may include a noble gas or nitrogen.

As shown in FIG. 1H, upon removal of the cap layer 120, the organic material 150, and the damaged, exposed surfaces of sidewalls 134, the substrate 140 with insulation layer 130 having feature 132' remains. The damaged, exposed surfaces of sidewalls 134 (following, for example, an etch process, or an ash process) may be removed before, during, or after the removal of cap layer 120. The damaged, exposed surfaces of sidewalls 134 may be removed using a dry or wet cleaning process. For example, the damaged, exposed surfaces of sidewalls 134 may be removed using a dry, non-plasma etching process. As noted above, a dry non-plasma etching process includes a self-limiting feature for process control, which can minimize the amount of the sidewall of feature 132' in insulation layer 130 that is removed. Further, since the removal of damaged material leads to an increase in the critical dimension (CD) of the features 132, in one embodiment the original pattern (i.e., the photo-lithographic pattern 112) can be selected to be smaller than the design CD for the features 132 in insulation layer 130 to compensate for the subsequent removal of damaged surface area.

Figure 4A:
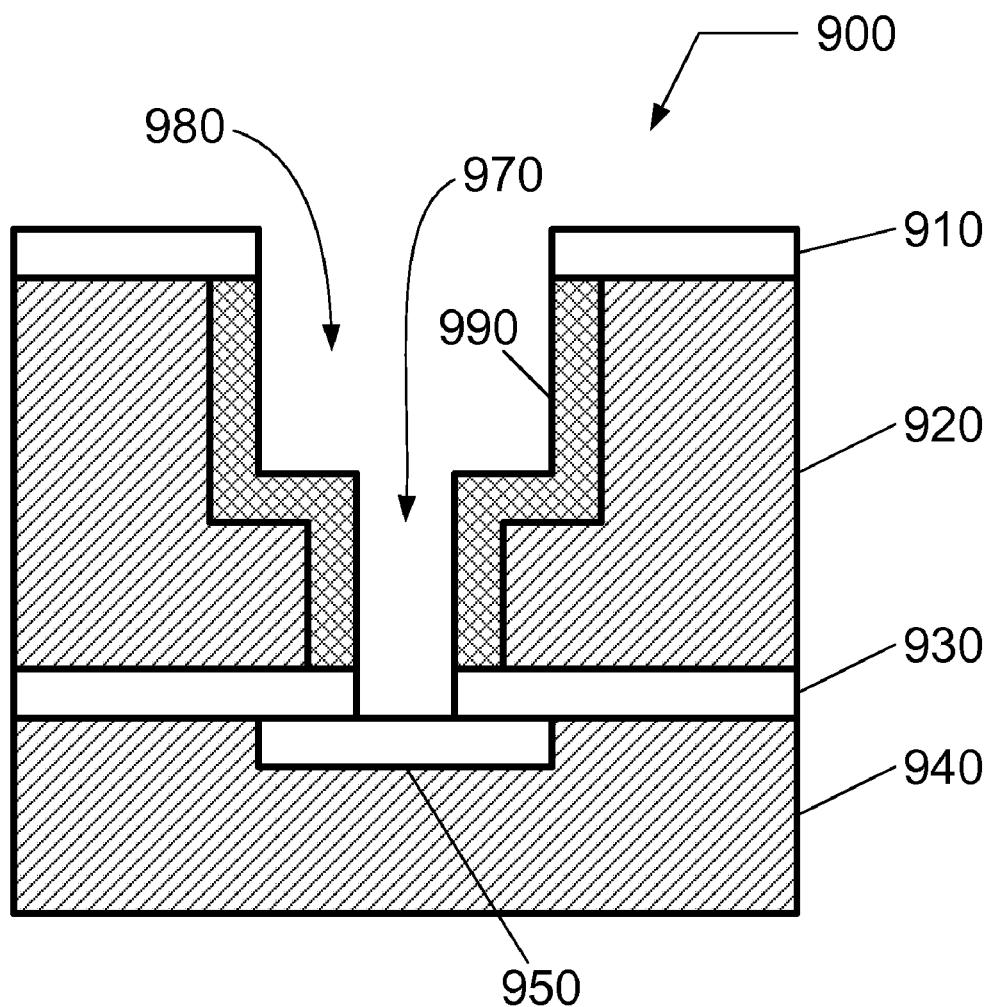
FIGS. 4A and 4B depict an exemplary sequence for processing a substrate when forming a trench or via in a back-end-of-line (BEOL) inter/intra-connect structure.
Figure 4B:
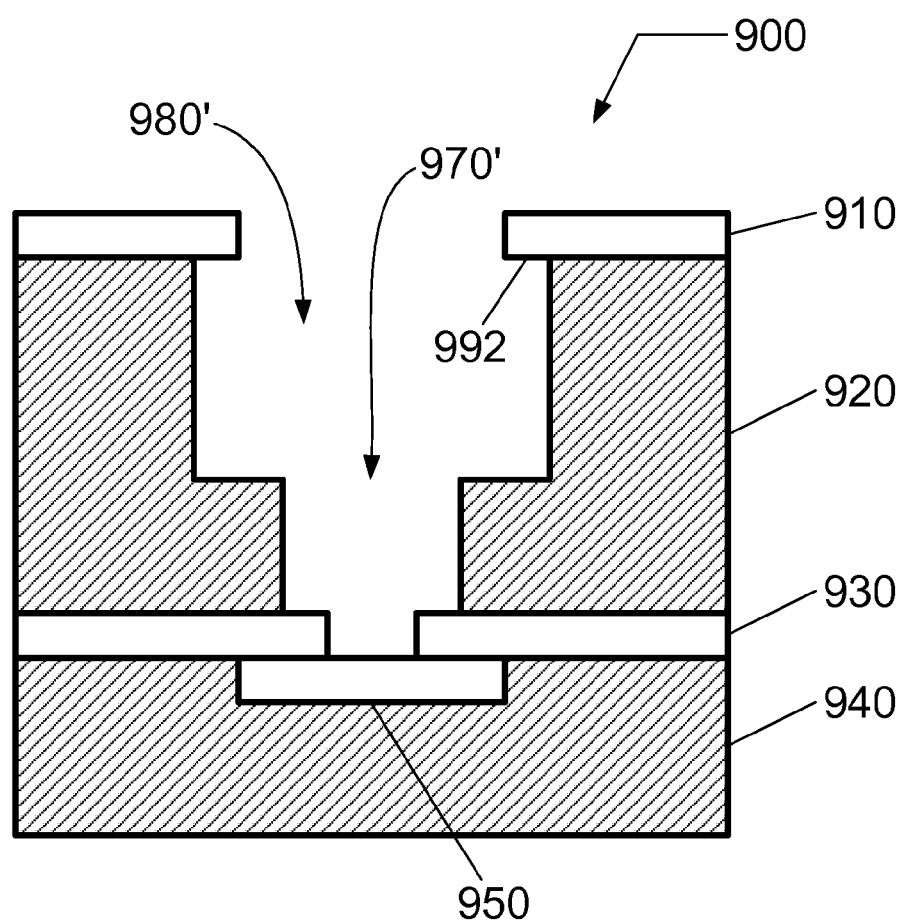

Referring now to FIGS. 4A and 4B, a trench-via structure 900 is illustrated. Trench-via structure 900 comprises a first dielectric layer 940, a first cap layer 930, a second dielectric layer 920, and a second cap layer 910. Therein, a sequence of etching processes are performed in order to create a via 970 and trench 980 which, when metallized in subsequent steps, can permit an electrical interconnection between a second metal line to be formed in trench 980 and a first metal line 950 in the first dielectric layer 940. The first and second dielectric layers 920, 940 may comprise low dielectric constant (low-k) material. The first and second cap layers 910, 930 may comprise $SiO_x$. During the sequence of etch processes, the second dielectric layer 920 may be damaged and form a damaged sub layer 990.

As illustrated in FIG. 4B, when removing the damaged sub layer 990 using conventional techniques to create a substantially damage-free via 970' and trench 980', the second cap layer 910 is undercut, thus forming an overhang 992. The overhang 992 can lead to difficulties when metallizing the trench-via structure 900.

Figure 5A:
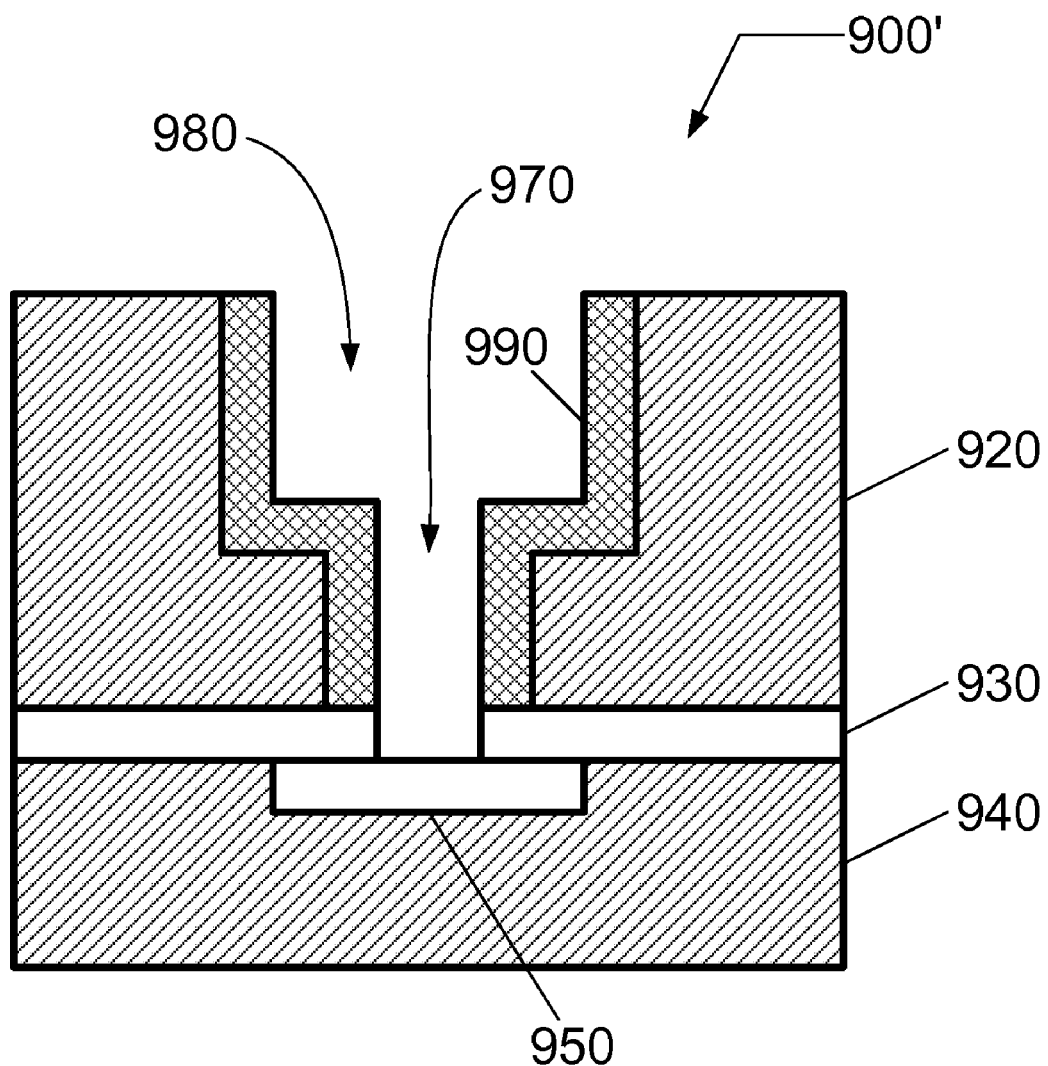
FIGS. 5A and 5B depict an exemplary sequence for processing a substrate when forming a trench or via in a back-end-of-line (BEOL) inter/intra-connect structure according to another embodiment.
Figure 5B:
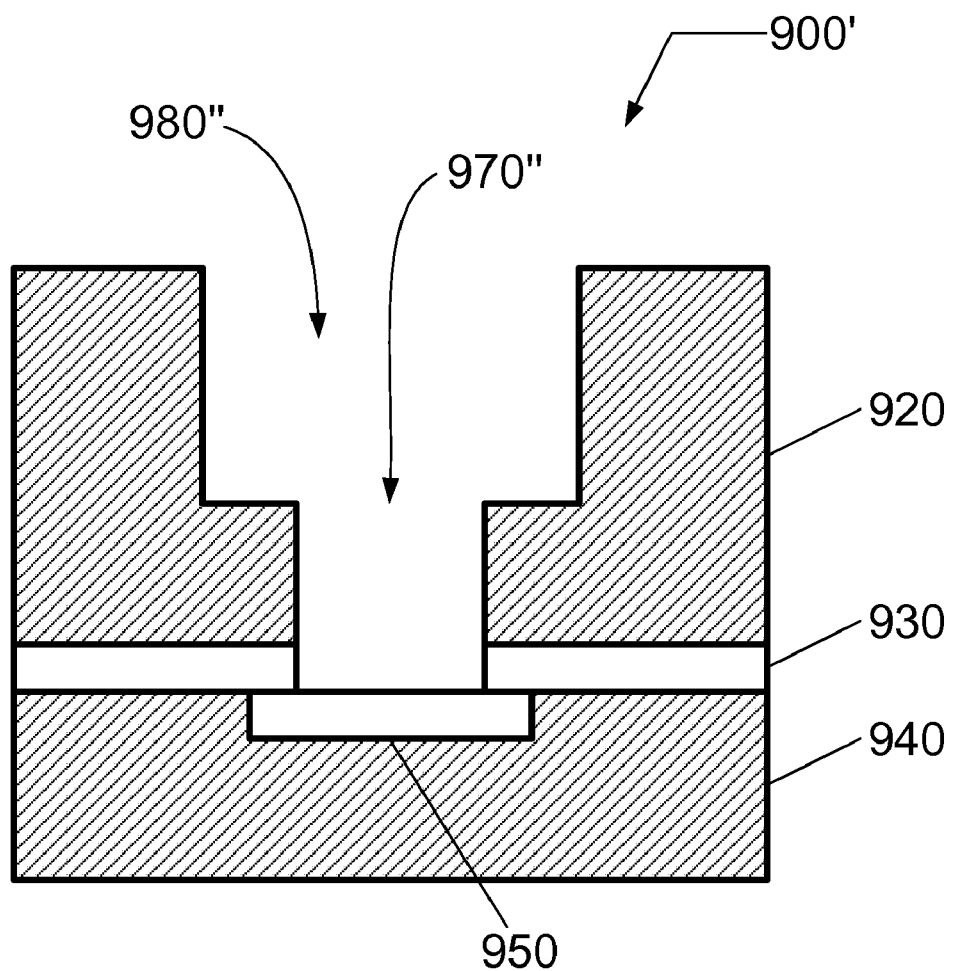

Referring now to FIGS. 5A and 5B, a trench-via interconnect structure 900' is illustrated. According to an embodiment, as illustrated in FIGS. 5A and 5B, the second cap layer 910 and the damaged sub layer 990 are removed from the trench-via structure 900'. The second cap layer 910 may be removed using a dry, non-plasma process as described above. The damaged sub layer 990 may be removed using a wet cleaning process or a dry cleaning process, such as a dry, non-plasma process as described above. The surface layers of the second cap layer 910 are chemically treated by a process gas comprising HF, or ammonia ($NH_3$), or both HF and $NH_3$. Following the chemical treatment process, a desorption process is performed in order to remove the chemically altered surface layers. The desorption can comprise a thermal treatment process within which the temperature of the substrate is raised sufficiently high to permit the volatilization of the chemically altered surface layers. Using the dry, non-plasma etching process can lead to a via 970" and trench 980" in the dielectric layer 920 having reduced damage on sidewalls.

Figure 6A:
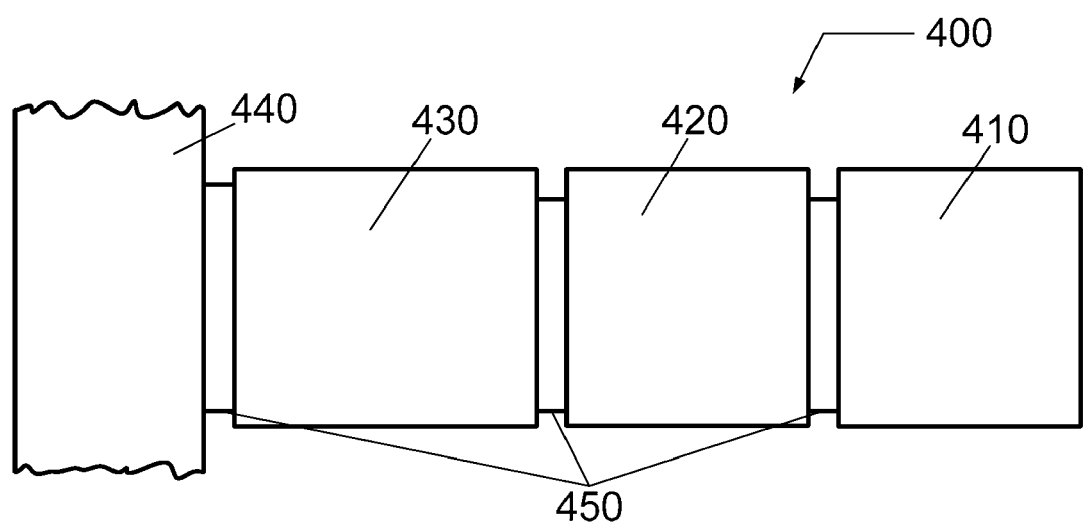
FIGS. 6A through 6C present schematic representations of a treatment system according to another embodiment of the invention.

According to one embodiment, FIG. 6A presents a processing system 400 for performing a dry, non-plasma removal process on a substrate. The processing system 400 comprises a first treatment system 410, and a second treatment system 420 coupled to the first treatment system 410. For example, the first treatment system 410 can comprise a chemical treatment system, and the second treatment system 420 can comprise a thermal treatment system. Alternately, the second treatment system 420 can comprise a substrate rinsing system, such as a water rinsing system.

Also, as illustrated in FIG. 6A, a transfer system 430 can be coupled to the first treatment system 410 in order to transfer substrates into and out of the first treatment system 410 and the second treatment system 420, and exchange substrates with a multi-element manufacturing system 440. The first and second treatment systems 410, 420, and the transfer system 430 can, for example, comprise a processing element within the multi-element manufacturing system 440. For example, the multi-element manufacturing system 440 can permit the transfer of substrates to and from processing elements including such devices as etch systems, deposition systems, coating systems, patterning systems, metrology systems, etc. In order to isolate the processes occurring in the first and second systems, an isolation assembly 450 can be utilized to couple each system. For instance, the isolation assembly 450 can comprise at least one of a thermal insulation assembly to provide thermal isolation, and a gate valve assembly to provide vacuum isolation. Of course, treatment systems 410 and 420, and transfer system 430 can be placed in any sequence.

Figure 6B:
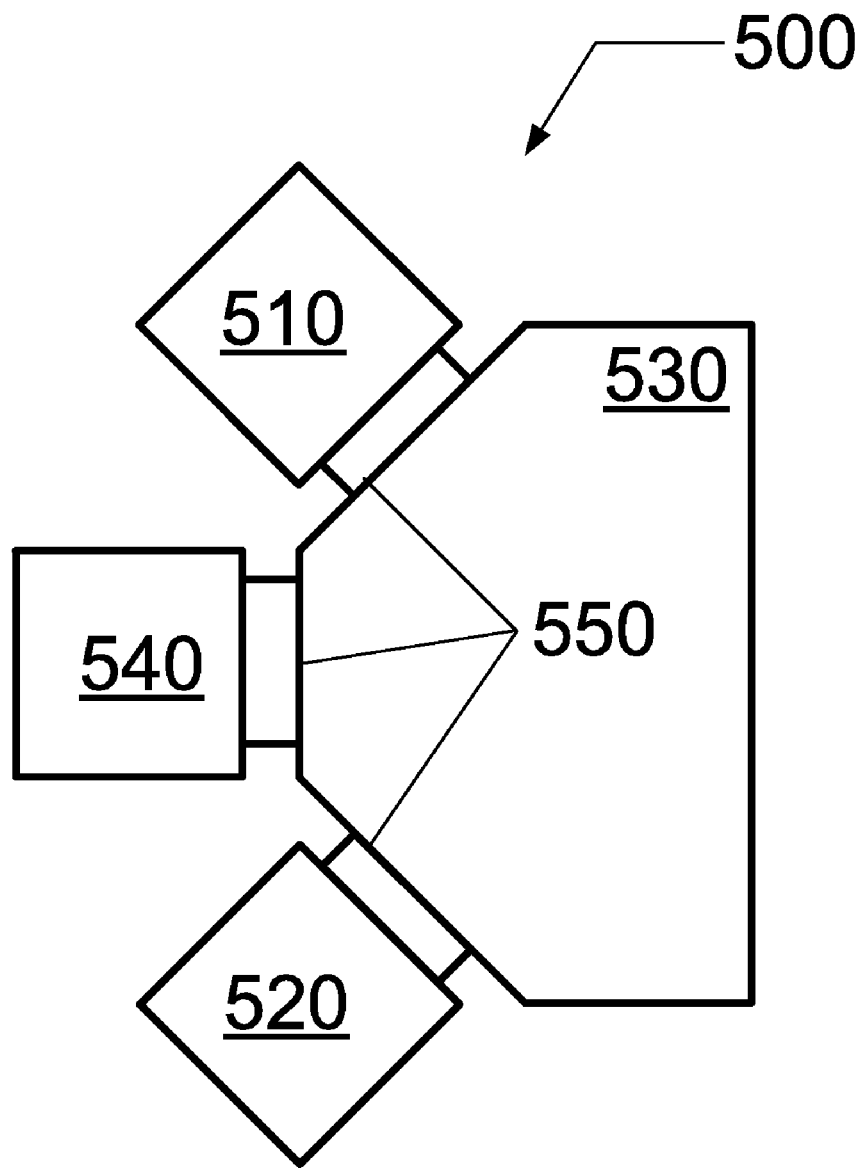

Alternately, in another embodiment, FIG. 6B presents a processing system 500 for performing a dry, non-plasma removal process on a substrate. The processing system 500 comprises a first treatment system 510, and a second treatment system 520. For example, the first treatment system 510 can comprise a chemical treatment system, and the second treatment system 520 can comprise a thermal treatment system. Alternately, the second treatment system 520 can comprise a substrate rinsing system, such as a water rinsing system. The processing system 500 may further comprises a third treatment system 540 configured to fill substrate features with organic material.

Also, as illustrated in FIG. 6B, a transfer system 530 can be coupled to the first treatment system 510 in order to transfer substrates into and out of the first treatment system 510, can be coupled to the second treatment system 520 in order to transfer substrates into and out of the second treatment system 520, and can be coupled to the third treatment system 540 in order to transfer substrates into and out of the third treatment system 540. Additionally, transfer system 530 can exchange substrates with one or more substrate cassettes (not shown). Although only two process systems are illustrated in FIG. 6B, other process systems can access transfer system 530 including such devices as etch systems, deposition systems, coating systems, patterning systems, metrology systems, etc. In order to isolate the processes occurring in the first and second systems, an isolation assembly 550 can be utilized to couple each system. For instance, the isolation assembly 550 can comprise at least one of a thermal insulation assembly to provide thermal isolation, and a gate valve assembly to provide vacuum isolation. Additionally, for example, the transfer system 530 can serve as part of the isolation assembly 550.

Figure 6C:
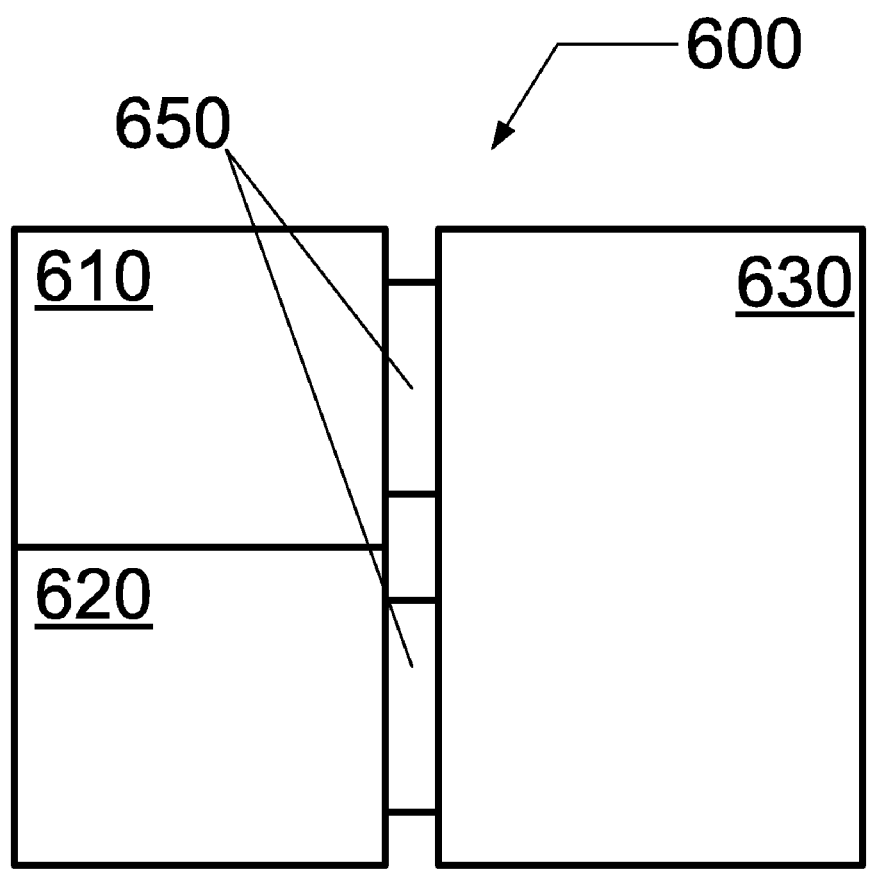

Alternately, in another embodiment, FIG. 6C presents a processing system 600 for performing a dry, non-plasma removal process on a substrate. The processing system 600 comprises a first treatment system 610, and a second treatment system 620, wherein the first treatment system 610 is stacked atop the second treatment system 620 in a vertical direction as shown. For example, the first treatment system 610 can comprise a chemical treatment system, and the second treatment system 620 can comprise a thermal treatment system. Alternately, the second treatment system 620 can comprise a substrate rinsing system, such as a water rinsing system.

Also, as illustrated in FIG. 6C, a transfer system 630 can be coupled to the first treatment system 610 in order to transfer substrates into and out of the first treatment system 610, and can be coupled to the second treatment system 620 in order to transfer substrates into and out of the second treatment system 620. Additionally, transfer system 630 can exchange substrates with one or more substrate cassettes (not shown). Although only two process systems are illustrated in FIG. 6C, other process systems can access transfer system 630 including such devices as etch systems, deposition systems, coating systems, patterning systems, metrology systems, etc. In order to isolate the processes occurring in the first and second systems, an isolation assembly 650 can be utilized to couple each system. For instance, the isolation assembly 650 can comprise at least one of a thermal insulation assembly to provide thermal isolation, and a gate valve assembly to provide vacuum isolation. Additionally, for example, the transfer system 630 can serve as part of the isolation assembly 650.

Figure 7:
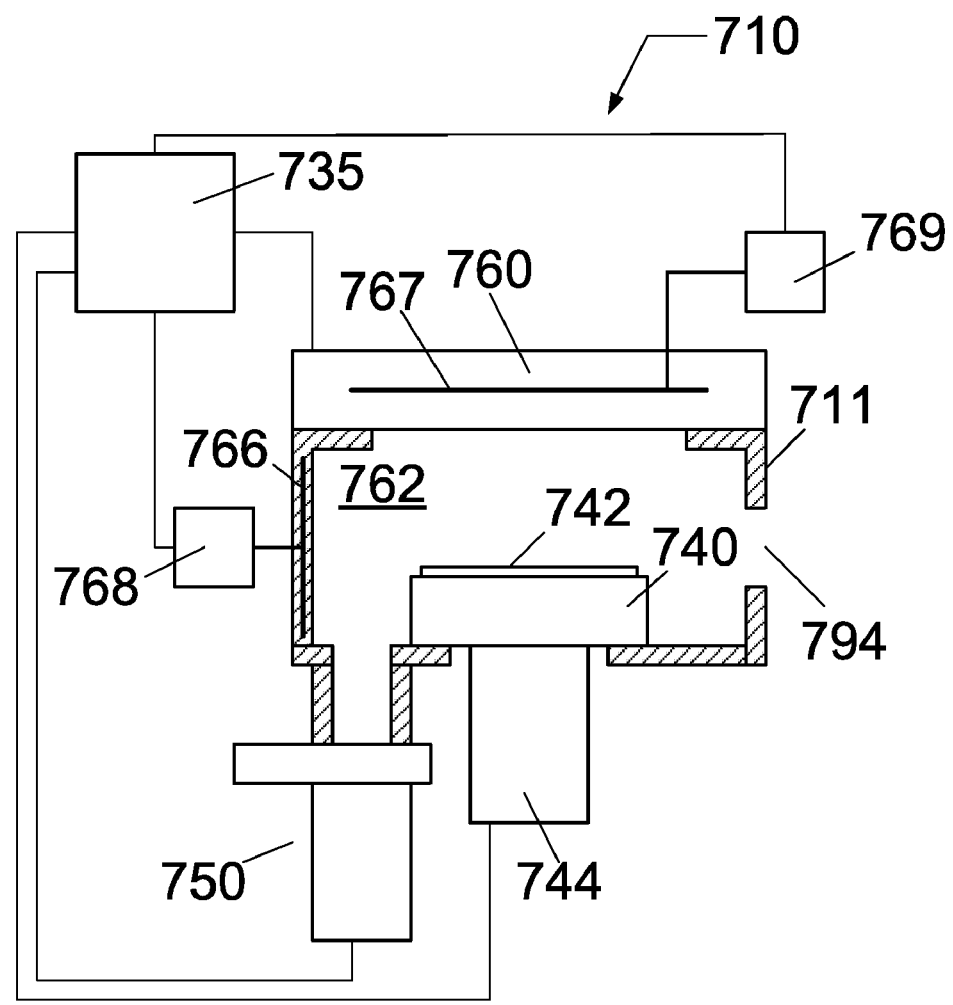
FIG. 7 presents a chemical treatment system according to another embodiment of the invention.

As illustrated in FIG. 7, a chemical treatment system 710 comprises a temperature controlled substrate holder 740 configured to be substantially thermally isolated from the chemical treatment chamber 711 and configured to support a substrate 742, a vacuum pumping system 750 coupled to the chemical treatment chamber 711 to evacuate the chemical treatment chamber 711, and a gas distribution system 760 for introducing a process gas into a process space 762 within the chemical treatment chamber 711. Substrate 742 can be transferred into and out of chemical treatment chamber 711 through transfer opening 794.

Additionally, the chemical treatment system 710 comprises a chamber temperature control element 766 coupled to a chamber temperature control system 768. The chamber temperature control element 766 can include a heating unit, or a cooling unit, or both. Furthermore, the chemical treatment system 710 comprises a gas distribution temperature control element 767 coupled to a gas distribution temperature control system 769. The gas distribution temperature control element 767 can include a heating unit, or a cooling unit, or both.

As illustrated in FIG. 7, the chemical treatment system 710 further comprises substrate holder 740 having a substrate holder assembly 744. Substrate holder assembly 744 can provide several operational functions for thermally controlling and processing substrate 742. For example, the substrate holder 740 and substrate holder assembly 744 may or may not comprise a substrate clamping system (i.e., electrical or mechanical clamping system), a heating system, a cooling system, a substrate backside gas supply system for improved thermal conductance between the substrate 742 and the substrate holder 740, etc.

Referring still to FIG. 7, a controller 735 may be coupled to the substrate holder assembly 744, the gas distribution system 760, the vacuum pumping system 750, the chamber temperature control system 768, and the gas distribution temperature control system 769. The controller 735 can include a microprocessor, memory, and a digital I/O port capable of generating control voltages sufficient to communicate and activate inputs to chemical treatment system 710 as well as monitor outputs from chemical treatment system 710.

Further details regarding the chemical treatment system 710 are described in U.S. Pat. No. 6,951,821 A1, entitled "Processing system and method for chemically treating a substrate"; the entire contents of which are incorporated herein by reference in their entirety.

Figure 8:
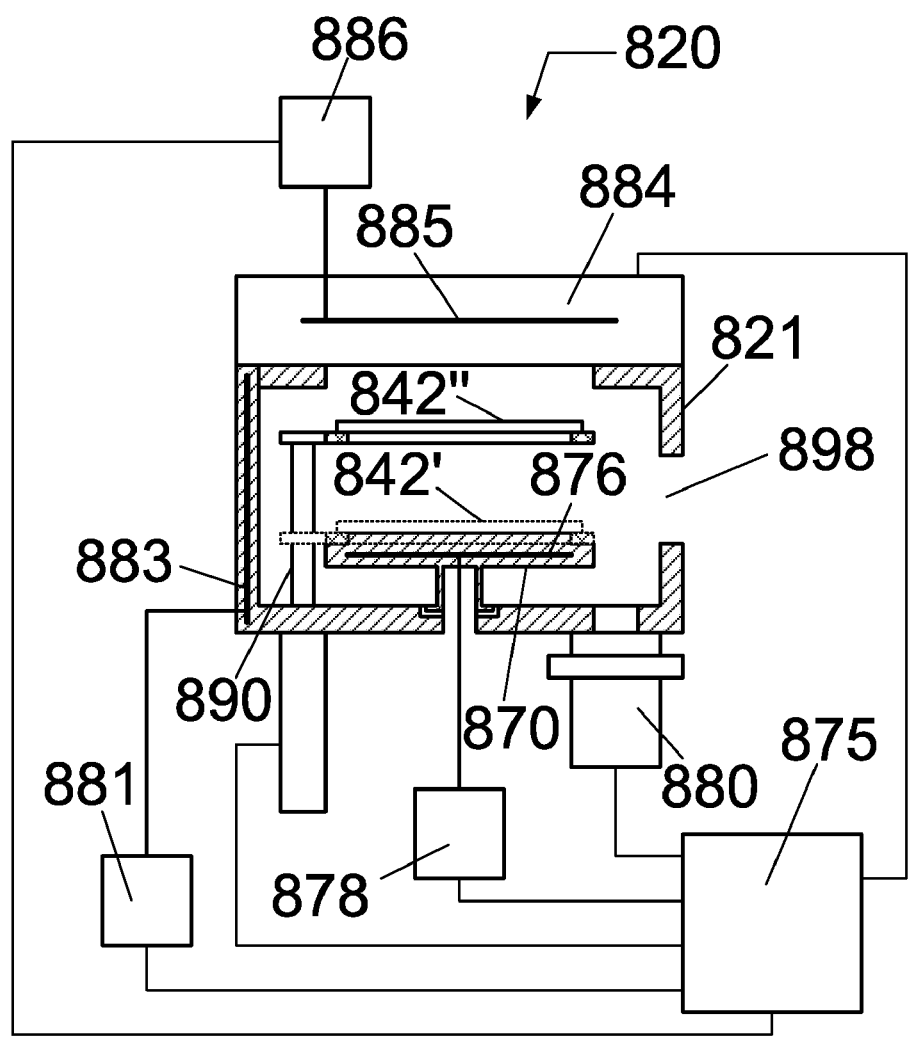
FIG. 8 presents a thermal treatment system according to another embodiment of the invention.

As illustrated in FIG. 8, a thermal treatment system 820 further comprises a temperature controlled substrate holder 870 mounted within the thermal treatment chamber 821 and configured to be substantially thermally insulated from the thermal treatment chamber 821 and configured to support a substrate 842', a vacuum pumping system 880 to evacuate the thermal treatment chamber 821, and a substrate lifter assembly 890 coupled to the thermal treatment chamber 821. Lifter assembly 890 can vertically translate substrate 842" between a holding plane (solid lines) and the substrate holder 870 (dashed lines), or a transfer plane located therebetween. The thermal treatment chamber 821 can further comprise an upper assembly 884 that may be configured to introduce a process gas, such as a purge gas, during thermal treatment of substrate 842'. Substrate 842' (or 842") can be transferred into and out of thermal treatment chamber 821 through transfer opening 898.

Additionally, the thermal treatment system 820 comprises a chamber temperature control element 883 coupled to a chamber temperature control system 881. The chamber temperature control element 883 can include a heating unit, or a cooling unit, or both. Furthermore, the thermal treatment system 820 comprises an upper assembly temperature control element 885 coupled to an upper assembly temperature control system 886. The upper assembly temperature control element 885 can include a heating unit, or a cooling unit, or both.

As illustrated in FIG. 8, the thermal treatment system 820 comprises substrate holder 870 having a substrate holder temperature control element 876 and a substrate holder temperature control system 878. The substrate holder temperature control element 876 can include a heating element, such as a resistive heating element. Furthermore, for example, the substrate holder 870 may or may not comprise a substrate clamping system (i.e., electrical or mechanical clamping system), an additional heating system, a cooling system, a substrate backside gas supply system for improved thermal conductance between the substrate 842' and the substrate holder 870, etc.

Referring still to FIG. 8, a controller 875 may be coupled to the upper assembly 884, the vacuum pumping system 880, the chamber temperature control system 881, the upper assembly temperature control system 886, the substrate holder temperature control system 878, and the substrate lifter assembly 890. The controller 875 can include a microprocessor, memory, and a digital I/O port capable of generating control voltages sufficient to communicate and activate inputs to thermal treatment system 820 as well as monitor outputs from thermal treatment system 820.

Further details regarding the thermal treatment system 820 are described in pending U.S. patent application Ser. No. 10/704,969, entitled "Processing system and method for thermally treating a substrate"; the entire contents are incorporated herein by reference in their entirety.

Although only certain embodiments of this invention have been described in detail above, those skilled in the art will readily appreciate that many modifications are possible in the embodiments without materially departing from the novel teachings and advantages of this invention. For example, although the cap layer overlies an insulation layer, it may also underlie an insulation layer. Additionally, for example, the cap layer may be a stop layer. Accordingly, all such modifications are intended to be included within the scope of this invention.

The invention claimed is:

1. A method of preparing an insulating film on a substrate, comprising:

disposing a substrate having an insulation layer and a cap layer overlying said insulation layer in a treatment system, wherein a pattern has been transferred to said cap layer and said insulation layer in order to form a feature through said cap layer and within said insulation layer, and wherein a surface layer of said insulation layer has been exposed to an etching plasma during said pattern transfer to said insulation layer;

filling said feature in said insulation layer with organic material prior to metalizing said feature;

following said filling said feature in said insulation layer with organic material, removing said cap layer using a dry non-plasma etching process, wherein said dry non-plasma etching process comprises:

exposing at least a portion of said cap layer to a process gas comprising HF or $NH_3$ or a combination thereof in order to chemically alter said cap layer, and thermally treating said chemically altered portion of said cap layer in order to desorb said chemically altered surface portion of said cap layer;

removing said organic material following said performing said dry non-plasma etching process on said cap layer;

performing another dry non-plasma etching process on said insulation layer to remove at least a portion of said exposed surface layer of said insulation layer by:

exposing said exposed surface layer of said insulation layer to a process gas comprising HF or $NH_3$ or a combination thereof in order to chemically alter said exposed surface layer of said insulation layer, and thermally treating said chemically altered exposed surface layer of said insulation layer in order to desorb said chemically altered surface layer.

2. The method of claim 1, wherein said dry non-plasma etching process comprises a self-limiting removal process.

3. The method of claim 1, wherein said organic material is applied using a spin coating process.

4. The method of claim 1, wherein said insulation layer comprises a low-k dielectric layer having a dielectric constant less than a value of 4.

5. The method of claim 4, wherein said low-k dielectric layer has a dielectric constant ranging from 1.6 to 2.7.

6. The method of claim 4, wherein said low-k dielectric layer comprises: a cured low-k dielectric material; an uncured low-k dielectric material; an organic material; an inorganic material; an inorganic-organic hybrid material; a porous dielectric material; a non-porous dielectric material; a single-phase material; a dual-phase material; an oxidized organo silane material; a silsesquioxane material; a silicate-based material; a collective material including silicon, carbon, and oxygen; or a collective material including silicon, carbon, oxygen, and hydrogen; or any combination of two or more thereof.

7. The method of claim 1, wherein said exposing said portion of said cap layer to said process gas causes chemical alteration of said cap layer to a self-limiting depth, and wherein said chemically altered portion of said cap layer to said self-limiting depth is removed during said thermal treating.

8. The method of claim 1, wherein said exposing said cap layer is performed at a process pressure ranging from approximately 1 mtorr to approximately 100 torr while said substrate is at a temperature ranging from approximately 10 degrees C. to approximately 200 degrees C.

9. The method of claim 1, wherein said process gas further comprises a noble gas.

10. The method of claim 1, wherein said thermally treating said chemically altered portion of said cap layer comprises elevating a temperature of said substrate to above approximately 100 degrees C.

11. The method of claim 10, wherein said thermally treating said chemically altered portion of said cap layer is performed during introducing a noble gas or nitrogen.

12. The method of claim 1, wherein said cap layer comprises silicon oxide ($Si_xO_y$), silicon nitride ($Si_xN_y$), silicon oxynitride ($Si_xO_yN_z$), or silicon oxycarbide ($Si_xO_yC_z$), or any combination of two or more thereof.

13. The method of claim 1, wherein said process gas comprises HF and $NH_3$, wherein said HF and $NH_3$ are introduced to said treatment system independent of one another.

14. The method of claim 1, wherein said process gas comprises $NH_3$, or $NH_3$ and a noble gas.

15. The method of claim 1, further comprising:
repeating said exposing said cap layer to said process gas and said thermally treating said chemically altered portion of said cap layer until said cap layer is removed.

16. The method of claim 1, wherein said feature comprises a trench, or a via, or a combination thereof.

* * * * *